United States Patent [19]

Owens

[11] Patent Number: 4,918,512

[45] Date of Patent: Apr. 17, 1990

[54] SEMICONDUCTOR PACKAGE HAVING AN OUTWARDLY ARCED DIE CAVITY

[75] Inventor: Norman L. Owens, Tempe, Ariz.

[73] Assignee: Motorola, Inc., Schaumburg, Ill.

[21] Appl. No.: 286,676

[22] Filed: Dec. 19, 1988

[51] Int. Cl.[4] .................. H01L 23/02; H01L 23/12; H01L 23/28; H01L 23/48

[52] U.S. Cl. .................................. 357/74; 357/70; 357/72; 357/74

[58] Field of Search .................. 357/70, 72, 74

[56] References Cited

U.S. PATENT DOCUMENTS 3,864,820  2/1975  Brenan et al. .................. 357/72

FOREIGN PATENT DOCUMENTS 0072133  4/1987  Japan .................. 357/70
0221653  9/1988  Japan .................. 357/74

Primary Examiner—Rolf Hille
Assistant Examiner—David M. Ostrowski
Attorney, Agent, or Firm—Harry A. Wolin

[57] ABSTRACT

A semiconductor package having a unique die cavity configuration wherein each side of the die cavity is arced outward from the center of the die cavity. This configuration is especially well suited for use in laminated multilayer ceramic packages.

10 Claims, 1 Drawing Sheet

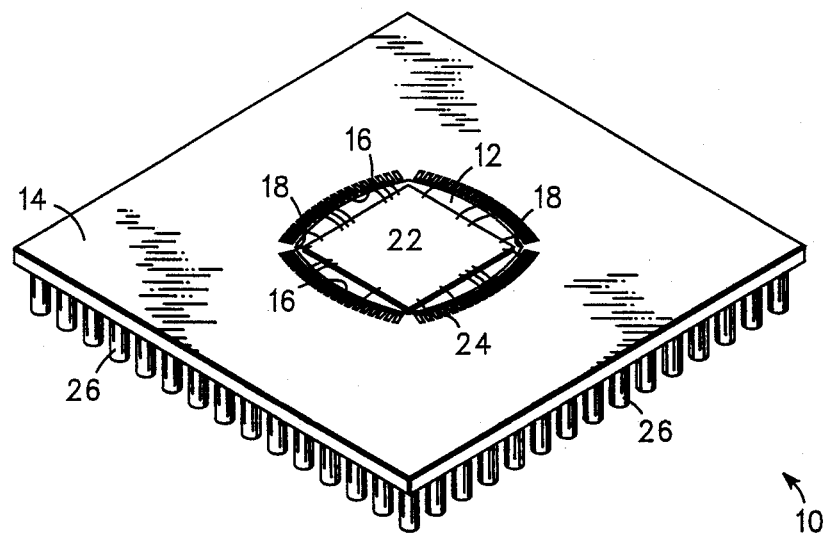
FIG. 1
FIG. 2
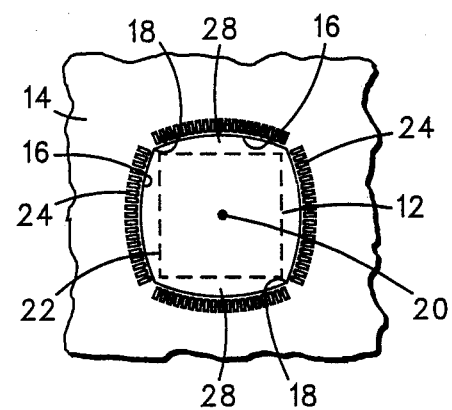

SEMICONDUCTOR PACKAGE HAVING AN OUTWARDLY ARCED DIE CAVITY

BACKGROUND OF THE INVENTION

This invention relates, in general, to semiconductor packages, and more particularly to a semiconductor package having an outwardly arced die cavity.

An often encountered problem in the assembly of semiconductor packages occurs when die attach material flows out of the die cavity and onto bond pads and bond posts. This problem greatly affects the wirebonding ability and reduces the attainable yield. Prior art attempts to remedy this problem have been somewhat successful although they have not completely eliminated the probelm and are often difficult to implement.

Prior art solutions include the formation of a moat within the die cavity. Excess die attach material is to flow into the moat before it flows up the cavity wall or the side of the semiconductor die. The use of this type moat has been successful in pressed ceramic packages as well as other one piece packages wherein the moat may be formed without significant variance in the fabrication process. However, moats are extremely difficult to form in laminated multilayer ceramic packages. The formation of a moat in this type package would most likely require use of an additional ceramic layer disposed so that desired package tolerances might be maintained. This would cause a significant increase in the difficulty and cost of manufacturing laminated multilayer ceramic packages.

Another prior art methhod of solving the die attach overflow problem has been to enlarge the size of the die cavity. Although this helps with the die attach overflow problem there are many logistical problems that are incurred by enlarging the die cavity size. First, the enlarged die cavity requires additional space and therefore, a larger semiconductor package is needed to maintain the required internal dimensions of the package. Second, there will be a larger space between the semiconductor die and the bond posts which are disposed about the cavity thereby increasing the length of the bonding wires and jeopardizing reliability.

In view of the above, a die cavity that would reduce the die attachment material overflow problem while maintaining or reducing the minimum necessary cavity size would be highly desirable.

SUMMARY OF THE INVENTION

Accordingly, it is an object of the present invention to provide a semiconductor package having an outwardly arced die cavity that reduces die attach material overflow problems.

Another object of this invention is to provide a semiconductor package having an outwardly arced die cavity that may be easily employed in both single and multilayer ceramic packages.

It is an additional object of the present invention to provide a semiconductor package having an outwardly arced die cavity that requires a minimal amount of area.

The foregoing and other objects and advantages are achieved in the present invention by one embodiment in which, as a part thereof, makes use of a die cavity having a plurality of sides wherein each side is outwardly arced from the center of the die cavity. This configuration allows for a reduced number of rejects due to die attach material overflow while reducing the minimum necessary die cavity size.

A more complete understanding of the present invention can be attained by considering the following detailed description in conjunction with the accompanying drawings.

BRIEF DESCRIPTION OF THE DRAWINGS

FIG. 1 illustrates an enlarged perspective view of a semiconductor package having the die cavity exposed; and FIG. 2 is a highly enlarged top view of an outwardly arced die cavity of a semiconductor package.

DETAILED DESCRIPTION OF THE INVENTION

FIG. 1 illustrates an enlarged perspective view of a semiconductor package 10 having its die cavity 12 exposed while FIG. 2 is a highly enlarged top view of die cavity 12 of semiconductor package 10. Semiconductor package 10 includes a body 14 having die cavity 12 therein. In this embodiment, body 14 of semiconductor package 10 is comprised of a ceramic although it may be comprised of many other materials well known in the art. Ceramic body 14 may be a one piece pressed ceramic or may be a lamination of a plurality of ceramic layers.

Die cavity 12 is of a unique configuration and includes four sides 16. A plurality of corners 18 are between each side 16 of die cavity 12. Corners 18 are defined by an angle or radius of greater than 90 degrees. Each side 16 of die cavity 12 is arced outward from the center 20 of die cavity 12.

A semiconductor die 22 is disposed in die cavity 12. One of many well known die attach materials is used to bond semiconductor die 22 to die cavity 12. The unique configuration of die cavity 12 allows the minimum necessary die cavity size to be kept relatively small while inhibiting the die attach material from flowing onto bond pads of semiconductor die 22 or onto bond posts 24. As shown, this configuration allows for excess die attach material to first flow into recesses 28 where it can cause no harm.

Bond posts 24 are disposed about die cavity 12 and are arranged in the same configuration. The configuration of bond posts 24 allows for the disposition of an increased number of bond posts 24 about die cavity 12 and also for them to be of a more uniform size throughout. Semiconductor die 22 is selectively wire bonded to bond posts 24 so that an electrical signal may be relayed to leads 26 which extend from body 14 of semiconductor package 10.

Thus it is apparent that there has been provided, in accordance with the invention, an improved semiconductor package having a unique die cavity configuration that meets the objects and advantages set forth above. While specific embodiments of the present invention have been shown and described, further modifications and improvements will occur to those skilled in the art. It is desired that it be understood, therefore, that this invention is not limited to the particular form shown and it is intended in the appended claims to cover all modifications which to not depart from the spirit and scope of this invention.

I claim:

1. A semiconductor device package comprising a die cavity having four sides and a corner between each of said four sides, each of said corners being defined by an angle of greater than 90 degrees.

2. The semiconductor device package of claim 1 further comprising a plurality of bond posts arranged in the same configuration as the die cavity.

3. The semiconductor device package of claim 1 wherein said package is comprised of a ceramic.

4. The semiconductor device package of claim 3 wherein said package is a multilayer package.

5. An integrated circuit package comprising:
   a body
   a die cavity disposed in said body, said die cavity having a plurality of sides wherein each member of said plurality of sides is arced outward from the center of said die cavity;
   a plurality of bond posts disposed about said die cavity and arranged in the same configuration as said die cavity;
   a semiconductor die disposed in said die cavity and selectively wirebonded to said plurality of die bond posts; and
   a plurality of leads extending from said body and being electrically connected to said plurality of bond posts.

6. The integrated circuit package of claim 5 wherein the die cavity includes four sides and a corner between each of said four sides defined by an angle of greater than 90 degrees.

7. The integrated circuit package of claim 5 wherein the body is comprised of a ceramic.

8. The integrated circuit package of claim 7 wherein the body is comprised of a plurality of layers.

9. An integrated circuit package comprising:
   a laminated multilayer ceramic body;
   a die cavity disposed in said body, said die cavity having a plurality of sides wherein each member of said plurality of sides is arced outward from the center of said die cavity;
   a plurality of bond posts disposed about said die cavity;
   a semiconductor die disposed in said die cavity and selectively wirebonded to said plurality of die bond posts; and
   a plurality of leads extending from said body and being electrically connected to said plurality of bond posts.

10. The integrated circuit package of claim 9 wherein the die cavity includes four sides and a corner between each of said four sides defined by an angle of greater than 90 degrees.

* * * * *